US008194550B2

(12) United States Patent
Shorey et al.

(10) Patent No.: US 8,194,550 B2
(45) Date of Patent: Jun. 5, 2012

(54) TRUST-BASED METHODOLOGY FOR SECURING VEHICLE-TO-VEHICLE COMMUNICATIONS

(75) Inventors: Rajeev Shorey, New Delhi (IN); Anitha Varghese, Parakkadavu (IN); Bhargav Ramchandra Bellur, Bangalore (IN)

(73) Assignee: GM Global Technology Operations LLC, Detroit, MI (US)

( * ) Notice: Subject to any disclaimer, the term of this patent is extended or adjusted under 35 U.S.C. 154(b) by 716 days.

(21) Appl. No.: 12/368,100

(22) Filed: Feb. 9, 2009

(65) Prior Publication Data

US 2010/0201543 A1 Aug. 12, 2010

(51) Int. Cl.

| | |
|---|---|
| ***G01R 31/08*** | (2006.01) |
| ***G06F 11/00*** | (2006.01) |
| ***G08C 15/00*** | (2006.01) |
| ***H04J 1/16*** | (2006.01) |
| ***H04J 3/14*** | (2006.01) |
| ***H04L 1/00*** | (2006.01) |
| ***H04L 12/26*** | (2006.01) |
| *G08B 13/14* | (2006.01) |
| *G08B 1/00* | (2006.01) |
| *H04Q 1/30* | (2006.01) |
| *G08G 1/01* | (2006.01) |
| *G08G 1/16* | (2006.01) |

(52) U.S. Cl. ..................... 370/235; 340/933; 340/572.1; 340/531; 701/301

(58) Field of Classification Search ........................ None
See application file for complete search history.

(56) References Cited

U.S. PATENT DOCUMENTS

| | | | | |
|---|---|---|---|---|
| 6,542,583 | B1 | 4/2003 | Taylor | |
| RE38,870 | E * | 11/2005 | Hall | 701/301 |
| 2004/0003252 | A1 * | 1/2004 | Dabbish et al. | 713/175 |
| 2006/0202862 | A1 * | 9/2006 | Ratnakar | 340/933 |
| 2008/0211649 | A1 * | 9/2008 | Hines et al. | 340/441 |
| 2009/0076965 | A1 * | 3/2009 | Elson et al. | 705/55 |
| 2010/0106364 | A1 | 4/2010 | Sagisaka | |

FOREIGN PATENT DOCUMENTS

| | | | |
|---|---|---|---|
| JP | 2008-077484 | A | 4/2008 |
| JP | 2008-197702 | A | 8/2008 |

* cited by examiner

*Primary Examiner* — Xavier Szewai Wong
(74) *Attorney, Agent, or Firm* — John A. Miller; Miller IP Group, PLC

(57) ABSTRACT

A vehicle-to-vehicle communications system that employs a challenge/response based process to ensure that information received from a vehicle is reliable. The subject vehicle transmits a challenge question to the suspect vehicle to determine whether the suspect vehicle is a reliable source of information. The process increases a number of tokens in a token bucket for the suspect vehicle if the response to the challenge question is correct, and decreases the number of tokens in the token bucket for the suspect vehicle if the response to the challenge question is incorrect. The subject vehicle accepts a message from the suspect vehicle if the number of tokens in the bucket for the suspect vehicle is greater than a predetermined upper threshold, and discards the message from the suspect vehicle if the number of tokens in the bucket for the suspect vehicle is less than a predetermined lower threshold.

18 Claims, 2 Drawing Sheets

TRUST-BASED METHODOLOGY FOR SECURING VEHICLE-TO-VEHICLE COMMUNICATIONS

BACKGROUND OF THE INVENTION

1. Field of the Invention

This invention relates generally to a system and method for identifying a reliable vehicle in a vehicle-to-vehicle communications system and, more particularly, to a system and method for assuring that information received from a vehicle in a vehicle-to-vehicle communication system is reliable and not malicious.

2. Discussion of the Related Art

Traffic accidents and roadway congestion are significant problems for vehicle travel. Vehicular ad-hoc network based active safety and driver assistance systems are known that allow a vehicle communications system to transmit messages to other vehicles in a particular area with warning messages about dangerous road conditions, driving events, accidents, etc. In these systems, multi-hop geocast routing protocols, known to those skilled in the art, are commonly used to extend the reachability of the warning messages, i.e., to deliver active messages to vehicles that may be a few kilometers away from the road condition, as a one-time multi-hop transmission process. In other words, an initial message advising drivers of a potential hazardous road condition is transferred from vehicle to vehicle using the geocast routing protocol so that vehicles a significant distance away will receive the messages because one vehicle's transmission distance is typically relatively short.

Vehicle-to-vehicle and vehicle-to-infrastructure applications require a minimum of one entity to send information to another entity. For example, many vehicle-to-vehicle safety applications can be executed on one vehicle by simply receiving broadcast messages from a neighboring vehicle. These messages are not directed to any specific vehicle, but are meant to be shared with a vehicle population to support the safety application. In these types of applications, where collision avoidance is desirable, as two or more vehicles talk to each other and a collision becomes probable, the vehicle systems can warn the vehicle drivers, or possibly take evasive action for the driver, such as applying the brakes. Likewise, traffic control units can observe the broadcast of information and generate statistics on traffic flow through a given intersection or roadway. Once a vehicle broadcasts a message, any consumer of the message could be unknown.

It is generally necessary that the information received from a vehicle in these types of vehicle-to-vehicle communications system be reliable to ensure that the vehicle is not attempting to broadcast malicious information that could result in harmful activity, such as a vehicle collision. One current solution for providing trust of the information broadcasted is by transmitting public keys, referred to as public key infrastructure (PKI), so that a vehicle that transmits a certain key is identified as a trusted source. However, transmitting a key between vehicles for identification purposes has a number of drawbacks particularly in system scalability. For example, the number of vehicles that may participate in a vehicle-to-vehicle communications system could exceed 250,000,000 vehicles in the United States alone. Also, the transmission of the key has limitations as to its timeliness of access to the PKI while on the road, the availability of the PKI from anywhere, the bandwidth to the PKI for simultaneous access and the computations needed for PKI certification, reissuance, etc.

SUMMARY OF THE INVENTION

In accordance with the teachings of the present invention, a vehicle-to-vehicle or vehicle-to-infrastructure communications system is disclosed that employs a challenge/response based process and algorithm to ensure that information received from a vehicle is reliable. A subject vehicle may receive a message from a suspect vehicle. The subject vehicle determines whether there is a memory bucket stored on the subject vehicle for the suspect vehicle, and if not, the subject vehicle creates a bucket for the suspect vehicle. The subject vehicle transmits a challenge question from the subject vehicle to the suspect vehicle to determine whether the suspect vehicle is a reliable source of information. The algorithm increases a number of tokens in the bucket for the suspect vehicle if the response to the challenge question is correct, and decreases the number of tokens in the token bucket for the suspect vehicle if the response to the challenge question is incorrect. The subject vehicle accepts the message from the suspect vehicle if the number of tokens in the bucket for the suspect vehicle is greater than a predetermined upper threshold, and discards the message from the suspect vehicle if the number of tokens in the bucket for the suspect vehicle is less than a predetermined lower threshold. The algorithm deletes the token bucket for a suspect vehicle if the subject vehicle has not received a message from the suspect vehicle for a predetermined period of time.

Additional features of the present invention will become apparent from the following description and appended claims, taken in conjunction with the accompanying drawings.

DETAILED DESCRIPTION OF THE EMBODIMENTS

The following discussion of the embodiments of the invention directed to a vehicle-to-vehicle communications system employing a process for ensuring messages received from a vehicle are reliable is merely exemplary in nature, and is in no way intended to limit the invention or its applications or uses.

The present invention proposes a trust-based model in a vehicle-to-vehicle and vehicle-to-infrastructure communications system that will increase the knowledge that communications received by a vehicle are reliable and not malicious. The trust-based model of the communications system is a challenge/response process that is intended to segregate trusted vehicles from malicious vehicles or other nodes. Certain assumptions are made in the trust-based model, including that each vehicle is equipped with a GPS device that enables the vehicle to know its spatial coordinates. Further, each vehicle that is part of the communications system has a number of token buckets, or digital buffers storing counts, corresponding to all of the vehicles it may be communicating with. The number of tokens in the bucket corresponds to the amount of trust that that vehicle has been given. Each token bucket in the vehicle is deleted after a certain period of time has elapsed if a communication with that vehicle has not occurred. The objective to delete a token bucket is to keep the memory requirements in the vehicle as low as possible.

Figure 1:
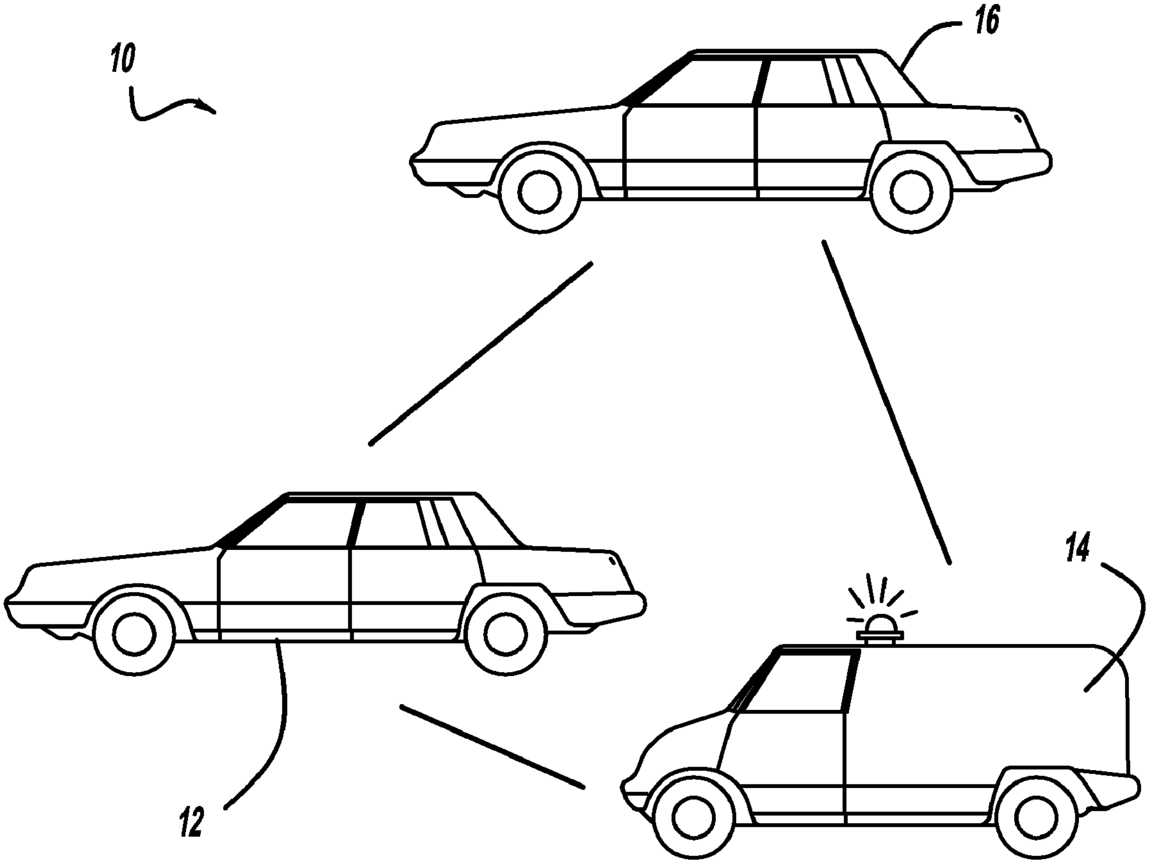
FIG. 1 is a plan view of a plurality of vehicles in close proximity to each other that are transmitting information over a vehicle-to-vehicle communications system.

FIG. 1 is a plan view of a vehicle-to-vehicle or vehicle-to-infrastructure communications system 10 where information and data is transferred between vehicles 12 and 16 and an infrastructure 14. A certain vehicle 12 may notice that another vehicle 16 has entered its communication range, and is sending a message. The vehicle 12 may wish to determine whether the vehicle 16 is a trustworthy vehicle from which the vehicle 12 can receive reliable information. In order to provide this trust, the vehicle 12 may issue a challenge communication to the vehicle 16 that the vehicle 16 will respond to. If the vehicle 16 issues a correct answer to the challenge from the vehicle 12, the number of tokens in a token bucket stored on the vehicle 12 will be increased for the vehicle 16 to increase is trustworthiness for messages. With each incorrect answer, the number of tokens in the bucket associated with the vehicle 16 is reduced to decrease the likelihood that the vehicle 16 is a reliable source of information. Therefore over time, as the vehicle 12 encounters the vehicle 16, the bucket for the vehicle 16 in the vehicle 12 can be increased and decreased to determine whether the vehicle 16 is likely to transmit reliable information.

The challenge questions transmitted by one vehicle to another vehicle to determine its trustworthiness can be any suitable question that the transmitting vehicle will know the answer to. For example, the vehicle 12 can ask the vehicle 16 where it is located. If the vehicle 16 responds with an answer that the vehicle 12 knows is reliable because of the transmission distance, or other knowledge, then the vehicle 12 can assume that other information from the vehicle 16 is reliable.

As a vehicle travels along its everyday course, or over other courses, it will constantly be communicating with other vehicles to determine whether they are trustworthy. Thus, each time the vehicle 12 encounters another vehicle, it may issue a question or questions that the other vehicle will respond to, and the transmitting vehicle will know the answer to, at least generally. Each vehicle that the vehicle 12 encounters will have a bucket for that vehicle stored on the vehicle 12, and each time that an interrogated vehicle responds with the correct answer, the number of tokens in the bucket for that vehicle is increased, indicating that the interrogated vehicle is more reliable. For each wrong answer that the interrogated vehicle gives, tokens are removed from that vehicles bucket, thus decreasing the probability that that vehicle is a reliable source for information. Because memory on the vehicle 12 is a premium, a bucket or buffer for a vehicle is only maintained if that vehicle is encountered often enough to make keeping a bucket for that vehicle cost worthy. Therefore, if a predetermined period of time, such as three months, has gone by where the vehicle is not encountered again, the bucket for that vehicle can be deleted.

Figure 2:
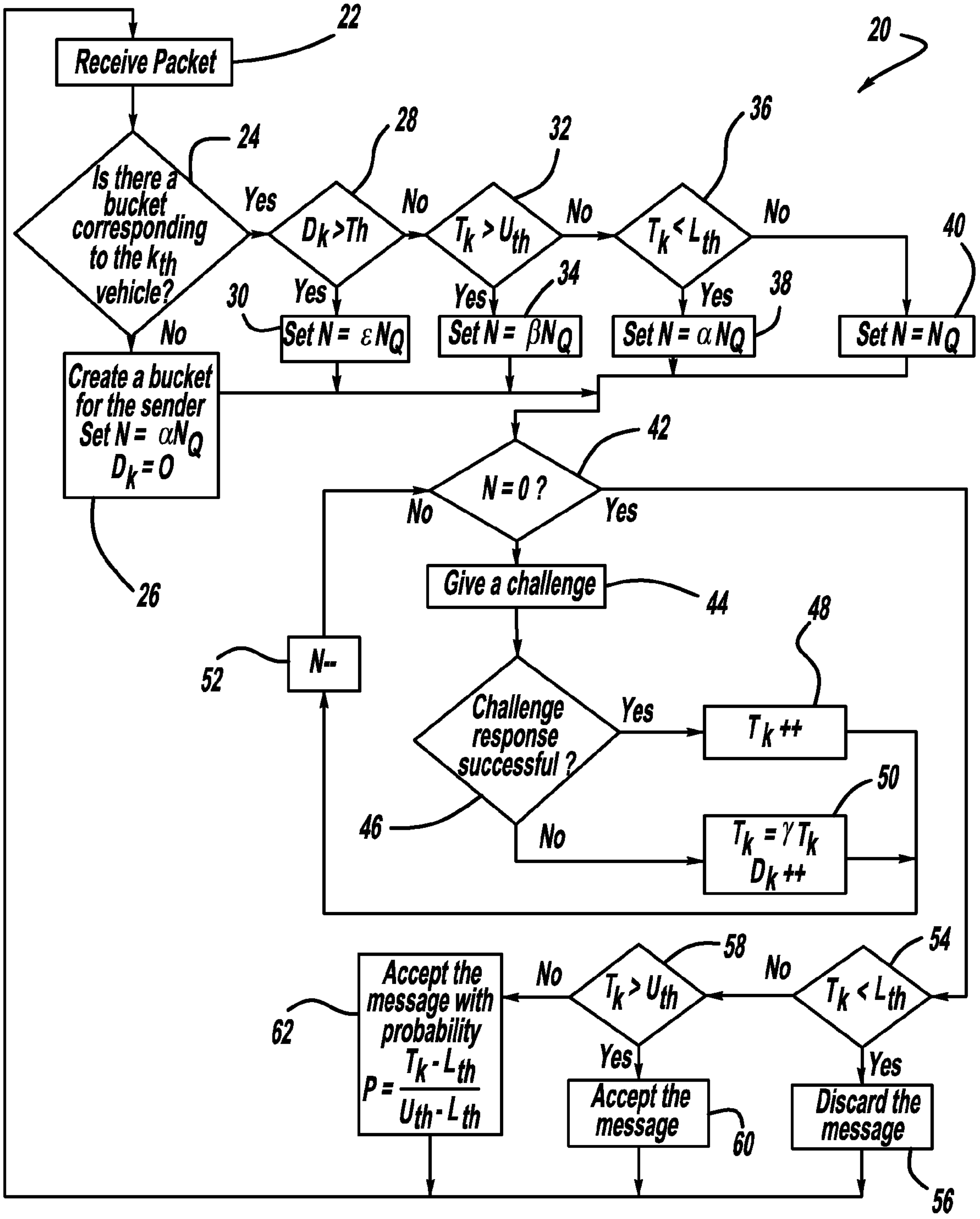
FIG. 2 is flow chart diagram showing a process for determining whether information received from a vehicle over a vehicle-to-vehicle communications system is trusted and reliable, according to an embodiment of the present invention.

FIG. 2 is a flow chart diagram 20 showing a process by which the tokens in a bucket for a particular vehicle is increased and decreased to identify the probability that the vehicle is a reliable source of information. The process is event driven. The algorithm is triggered whenever a vehicle receives a message or packet from another vehicle, at box 22, referred to as the $k_{th}$ vehicle. The packet received from the $k_{th}$ vehicle may include any suitable information consistent with the communications system, such as vehicle location, vehicle heading, vehicle velocity, vehicle acceleration, information about a traffic accident, lane position, etc. When the message is received, the algorithm determines if a bucket has already been created or stored for the $k_{th}$ vehicle in the subject vehicle, at decision diamond 24. If there is not a bucket corresponding to the $k_{th}$ vehicle, then the algorithm creates a bucket for the $k_{th}$ vehicle at box 26, and sets $N=\alpha N_Q$ and $D_k=0$, where N is the number of questions to be asked by the subject vehicle in a challenge/response inquiry, $\alpha$ is a positive constant less than 1 and $D_k$ is the number of negative answers received from the $k_{th}$ vehicle, where the negative answers is zero when the bucket is created. The values $\beta$, $\gamma$ and $\epsilon$ are also positive constants less than one.

If there is a bucket corresponding to the $k_{th}$ vehicle at the decision diamond 24, the algorithm then determines whether the number of wrong answers $D_k$ is greater than a predetermined threshold Th from previous challenges and responses for the $k_{th}$ vehicle at decision diamond 28. If the number of wrong answers is greater than the threshold Th at the decision diamond 28, then the algorithm sets the number of questions to be asked by the subject vehicle in the future to be $N=\epsilon N_Q$ to determine reliability at box 30. Because the number of wrong answers received from the $k_{th}$ vehicle is larger than the allowed threshold Th, more time and questions are needed to allow trust to be built up for the $k_{th}$ vehicle. Thus, the algorithm sets the number of questions $N_Q$ to be asked to be a fraction, i.e., $\epsilon N_Q$.

If the number of wrong answers $D_k$ is not greater than the threshold Th at the decision diamond 28, then the algorithm determines whether the number of tokens $T_k$ in the bucket is greater than a predetermined upper threshold $U_{th}$ which is the number of tokens that will establish trust in the $k_{th}$ vehicle, at decision diamond 32. If the number of tokens in the bucket is greater than the upper threshold $U_{th}$ at the decision diamond 32, then the algorithm sets the number of questions to be asked to $N=\beta N_Q$ at box 34. Because the number of tokens $T_k$ is above the upper threshold $U_{th}$, the vehicle trusts the $k_{th}$ vehicle, and sets the number of questions asked to a fraction $\beta$ of the number of questions $N_Q$, which is low.

If the number of tokens $T_k$ in the bucket is not greater than the upper threshold $U_{th}$ at the decision diamond 32, then the algorithm determines whether the number of tokens $T_k$ in the bucket is less than a lower threshold $L_{th}$ at decision diamond 36. If the number of tokens $T_k$ in the bucket is less than the lower threshold $L_{th}$ at the decision diamond 36, then the algorithm sets the number of questions to be asked to $N=\alpha N_Q$ at box 38. Because the number of tokens $T_k$ in the bucket is below the lower threshold $L_{th}$, the trust for the $k_{th}$ vehicle is low, which is either because the vehicle hasn't seen that $k_{th}$ vehicle very frequently or because the $k_{th}$ vehicle may have given too many wrong answers in the past. In either case, the probability that the $k_{th}$ vehicle is reliable is low so the number of questions is set to the fraction $N=\alpha N_Q$. If the number of tokens $T_k$ in the bucket is not less than the lower threshold $L_{th}$ at the decision diamond 36, then the algorithm sets the number of questions to be asked to $N=N_Q$ at box 40.

If the number of tokens $T_k$ is between the two thresholds $U_{th}$ and $L_{th}$, the algorithm will make a quicker decision as to whether to place confidence in messages from the $k_{th}$ vehicle, so the algorithm will ask more questions in the challenge response phase, where that number of questions is set to $N_Q$.

From the boxes 26, 30, 34, 38 and 40, the algorithm then proceeds to ask whether the number of questions N is equal to 0 at decision diamond 42. If the number of questions N is not equal to 0 at the decision diamond 40, then the interrogating vehicle will issue a challenge or question at box 44. The algorithm will then determine whether the response to the challenge is correct or not at decision diamond 46. If the response is correct at the decision diamond 46, then the algorithm increases the number of tokens in the bucket for that vehicle at box 48. Likewise, if the response to the challenge is wrong at the decision diamond 46, the number of wrong answers $D_k$ for the $k_{th}$ vehicle is increased and the number of tokens $T_k$ in the bucket is set to a fraction of the number of tokens $T_k$ by $\gamma$ at box 50. The algorithm then reduces the number of questions asked at box 52.

If the number of questions N to be asked equals 0 at the decision diamond 42, then the algorithm determines whether the number of tokens $T_k$ in the token bucket for the $k_{th}$ vehicle is less than the lower threshold $L_{th}$ at decision diamond 54. If the number of tokens $T_k$ is less than the lower threshold $L_{th}$ at the decision diamond 54, then the vehicle discards the message received from the $k_{th}$ vehicle at box 56 because the $k_{th}$ vehicle has been determined to be unreliable. If the number of tokens $T_k$ is not less than the lower threshold $L_{th}$ at the decision diamond 54, then the algorithm determines whether the number of tokens $T_k$ is greater than the upper threshold $U_{th}$ at decision diamond 58, and if so accepts the message received from the $k_{th}$ vehicle at box 60. If the number of tokens $T_k$ is less than the upper threshold $U_{th}$ at the decision diamond 58, and thus, between the upper threshold $U_{th}$ and the lower threshold $L_{th}$, the algorithm accepts the message from the $k_{th}$ vehicle with a certain probability at box 62. In one embodiment, the probability is defined as:

$$P = \frac{T_k - L_{th}}{U_{th} - L_{th}}$$

The foregoing discussion discloses and describes merely exemplary embodiments of the present invention. One skilled in the art will readily recognize from such discussion and from the accompanying drawings and claims that various changes, modifications and variations can be made therein without departing from the spirit and scope of the invention as defined in the following claims.

What is claimed is:

1. A method for determining whether information received from a vehicle is reliable in a vehicle-to-vehicle communications system, said method comprising:

receiving a message from a suspect vehicle by a subject vehicle;

determining whether there is a memory bucket stored on the subject vehicle for the suspect vehicle;

creating a memory bucket for the suspect vehicle if a memory bucket for the suspect vehicle does not exist on the subject vehicle;

transmitting a challenge question from the subject vehicle to the suspect vehicle to determine whether the suspect vehicle is reliable;

increasing a number of tokens in the bucket for the suspect vehicle if the suspect vehicle responds to the challenge question with a correct answer;

decreasing the number of tokens in the token bucket for the suspect vehicle if the response to the challenge question is incorrect;

accepting the message from the suspect vehicle if a number of tokens in the bucket for the suspect vehicle is greater than a predetermined upper threshold; and discarding the message from the suspect vehicle if the number of tokens in the bucket for the suspect vehicle is less than a predetermined lower threshold.

2. The method according to claim 1 further comprising accepting the message from the suspect vehicle with a predetermined probability if the number of tokens in the bucket is between the upper threshold and the lower threshold.

3. The method according to claim 1 wherein the probability is:

$$P = \frac{T_k - L_{th}}{U_{th} - L_{th}}$$

where P is the probability, $T_k$ is the number of tokens in the token bucket, $L_{th}$ is the lower threshold and $U_{th}$ is the upper threshold.

4. The method according to claim 1 further comprising determining whether a number of wrong answers previously received from the suspect vehicle is greater than a predetermined threshold, and if so, setting a number of challenge questions to be asked of the suspect vehicle to a first fraction of a predetermined number of questions.

5. The method according to claim 4 further comprising determining whether the number of tokens in the bucket for the suspect vehicle is greater than the upper threshold, and if so, setting the number of challenge questions to be asked of the suspect vehicle to a second fraction of the predetermined number of questions.

6. The method according to claim 5 further comprising determining whether the number of tokens in the bucket for the suspect vehicle is less than the lower threshold, and if so, setting the number of challenge questions to be asked of the suspect vehicle to a third fraction of the predetermined number of questions.

7. The method according to claim 6 further comprising setting the number of challenge questions to be asked of the suspect vehicle to the predetermined number of questions if the number of wrong answers previously received from the suspect vehicle is not greater than the predetermined threshold, the number of tokens in the bucket for the suspect vehicle is less than the upper threshold and the number of tokens in the bucket for the suspect vehicle is greater than the lower threshold.

8. The method according to claim 1 wherein decreasing the number of tokens in the token bucket includes decreasing the number of tokens by a fraction of the number of tokens in the bucket if the response to the challenge question is incorrect.

9. The method according to claim 1 wherein the challenge question is a location of the suspect vehicle.

10. The method according to claim 1 further comprising deleting the token bucket for a suspect vehicle if the subject vehicle has not received a message from the suspect vehicle for a predetermined period of time.

11. A method for determining whether information received from a vehicle is reliable in a vehicle-to-vehicle communications system, said method comprising:

receiving a message from a suspect vehicle by a subject vehicle;

determining whether there is a memory bucket stored on the subject vehicle for the suspect vehicle;

creating a memory bucket for the suspect vehicle if a memory bucket for the suspect vehicle does not exist on the subject vehicle;

transmitting a challenge question from the subject vehicle to the suspect vehicle to determine whether the suspect vehicle is reliable;

increasing a number of tokens in the bucket for the suspect vehicle if the suspect vehicle responds to the challenge question with a correct answer;

decreasing the number of tokens in the token bucket for the suspect vehicle if the response to the challenge question is incorrect;

accepting the message from the suspect vehicle if a number of tokens in the bucket for the suspect vehicle is greater than a predetermined upper threshold;

discarding the message from the suspect vehicle if the number of tokens in the bucket for the suspect vehicle is less than a predetermined lower threshold;

accepting the message from the suspect vehicle with a predetermined probability if the number of tokens in the bucket is between the upper threshold and the lower threshold; and deleting the token bucket for a suspect vehicle if the subject vehicle has not received a message from the suspect vehicle or a predetermined period of time.

12. The method according to claim 11 wherein the probability is:

$$P = \frac{T_k - L_{th}}{U_{th} - L_{th}}$$

where P is the probability, $T_k$ is the number of tokens in the token bucket, $L_{th}$ is the lower threshold and $U_{th}$ is the upper threshold.

13. The method according to claim 11 further comprising determining whether a number of wrong answers previously received from the suspect vehicle is greater than a predetermined threshold, and if so, setting a number of challenge questions to be asked of the suspect vehicle to a first fraction of a predetermined number of questions.

14. The method according to claim 13 further comprising determining whether the number of tokens in the bucket for the suspect vehicle is greater than the upper threshold, and if so, setting the number of challenge questions to be asked of the suspect vehicle to a second fraction of the predetermined number of questions.

15. The method according to claim 14 further comprising determining whether the number of tokens in the bucket for the suspect vehicle is less than the lower threshold, and if so, setting the number of challenge questions to be asked of the suspect vehicle to a third fraction of the predetermined number of questions.

16. The method according to claim 15 further comprising setting the number of challenge questions to be asked of the suspect vehicle to the predetermined number of questions if the number of wrong answers previously received from the suspect vehicle is not greater than the predetermined threshold, the number of tokens in the bucket for the suspect vehicle is less than the upper threshold and the number of tokens in the bucket for the suspect vehicle is greater than the lower threshold.

17. The method according to claim 11 wherein decreasing the number of tokens in the token bucket includes decreasing the number of tokens by a fraction of the number of tokens in the bucket if the response to the challenge question is incorrect.

18. The method according to claim 11 wherein the challenge question is a location of the suspect vehicle.

* * * * *